United States Patent
Hamlin

(10) Patent No.: US 7,764,137 B2
(45) Date of Patent: Jul. 27, 2010

(54) CIRCUIT AND METHOD FOR GENERATING ELECTRICAL SOLUTIONS WITH JUNCTION FIELD EFFECT TRANSISTORS

(75) Inventor: Christopher L. Hamlin, Los Gatos, CA (US)

(73) Assignee: SuVolta, Inc., Los Gatos, CA (US)

( * ) Notice: Subject to any disclaimer, the term of this patent is extended or adjusted under 35 U.S.C. 154(b) by 165 days.

(21) Appl. No.: 11/903,296

(22) Filed: Sep. 21, 2007

(65) Prior Publication Data

US 2008/0079493 A1    Apr. 3, 2008

Related U.S. Application Data

(60) Provisional application No. 60/848,253, filed on Sep. 28, 2006.

(51) Int. Cl.
*H03B 5/18*    (2006.01)

(52) U.S. Cl. .......... 331/107 DP; 331/107 SL; 331/103; 331/106; 331/173; 331/74

(58) Field of Classification Search ............ 331/103, 331/104, 106, 108 R, 108 A, 107 DP, 107 SL, 331/96, 173, 107 R
See application file for complete search history.

(56) References Cited

U.S. PATENT DOCUMENTS

| | | | |
|---|---|---|---|
| 3,412,296 A | 11/1968 | Grebene | |
| 3,930,300 A | 1/1976 | Nicolay | |
| 3,951,702 A | 4/1976 | Kano et al. | |
| 4,064,525 A | 12/1977 | Kano et al. | |
| 4,126,900 A | 11/1978 | Koomen et al. | |
| 4,228,367 A | 10/1980 | Brown | |
| 4,333,224 A | 6/1982 | Buchanan | |
| 4,613,772 A | 9/1986 | Young | |

(Continued)

FOREIGN PATENT DOCUMENTS

EP    0193842    9/1986

(Continued)

OTHER PUBLICATIONS

International Search Report for International Application No. PCT/US2007/079477, dated Apr. 9, 2008, DSM Solutions, Inc.

(Continued)

*Primary Examiner*—Robert Pascal
*Assistant Examiner*—Ryan Johnson
(74) *Attorney, Agent, or Firm*—Haverstock & Owens, LLP

(57) ABSTRACT

A circuit can include an amplifier having at least a first junction field effect transistor (JFET) of a first conductivity type with a source coupled to a first power supply node, and a drain coupled to an amplifier output node. A first variable bias circuit can be coupled between the drain and at least one gate of the first JFET. The first variable bias circuit can alter a direct current (DC) bias to the first JFET according a potential at the amplifier output node. A first bias impedance can be coupled between the drain of the first JFET and a second power supply node. The circuit can also include a non-linear transmission line (NLTL) coupled between the amplifier output and a gate of the first JFET. The NLTL being configured to propagate an electrical soliton.

10 Claims, 7 Drawing Sheets

U.S. PATENT DOCUMENTS

| | | | |
|---|---|---|---|
| 4,751,556 | A | 6/1988 | Cogan et al. |
| 4,777,517 | A | 10/1988 | Onodera et al. |
| 5,130,770 | A | 7/1992 | Blanc et al. |
| 5,327,098 | A | 7/1994 | Molina et al. |
| 5,618,688 | A | 4/1997 | Reuss |
| 5,773,891 | A | 6/1998 | Delgado |
| 5,789,994 | A | 8/1998 | Case et al. |
| 5,973,341 | A | 10/1999 | Letavic et al. |
| 6,307,223 | B1 | 10/2001 | Yu |
| 6,538,525 | B1 | 3/2003 | Williamson |
| 6,552,588 | B1 * | 4/2003 | Cruz-Albrecht ............. 327/164 |
| 7,298,176 | B2 * | 11/2007 | Ngo et al. .................... 326/119 |
| 7,339,440 | B2 * | 3/2008 | Ricketts et al. ......... 331/107 SL |
| 2002/0145484 | A1 | 10/2002 | Agoston et al. |
| 2002/0197779 | A1 | 12/2002 | Evans |
| 2006/0114550 | A1 | 6/2006 | Ricketts et al. |
| 2007/0096144 | A1 | 5/2007 | Kapoor |
| 2007/0126478 | A1 | 6/2007 | Kapoor |
| 2007/0262793 | A1 * | 11/2007 | Kapoor ....................... 326/101 |
| 2007/0284628 | A1 | 12/2007 | Kapoor |
| 2008/0225980 | A1 * | 9/2008 | Nishimura et al. .......... 375/295 |

FOREIGN PATENT DOCUMENTS

| | | | |
|---|---|---|---|
| GB | 2208967 A | | 4/1989 |
| JP | 60-258948 | | 12/1985 |
| JP | 60258948 A | | 12/1985 |
| WO | WO 2005099208 A1 * | | 10/2005 |
| WO | WO 2007030485 A2 * | | 3/2007 |

OTHER PUBLICATIONS

Written Opinion of the International Searching Authority for International Application No. PCT/US2007/079477, dated Apr. 9, 2008, DSM Solutions, Inc.

Ricketts et al., "Electrical Soliton Oscillator", *IEEE Transactions on Microwave Theory and Techniques*, Jan. 2006, pp. 373-381, vol. 54, No. 1.

Rodwell et al., "Active and Nonlinear Wave Propagation Devices in Ultrafast Electronics and Optoelectronics", *Proceedings of the IEEE*, Jul. 1994, pp. 1037-1059.

Takagi et al., "Complementary JFET Negative-Resistance Devices", *IEEE Journal of Solid-State Circuits*, Dec. 1975, pp. 509-515, vol. SC-10, No. 6.

Nanver et al., "Design Considerations for Integrated High-Frequency p-Channel JFET's", *IEEE Transactions on Electron Devices*, Nov. 1988, pp. 1924-1934, vol. 35, No. 11.

* cited by examiner

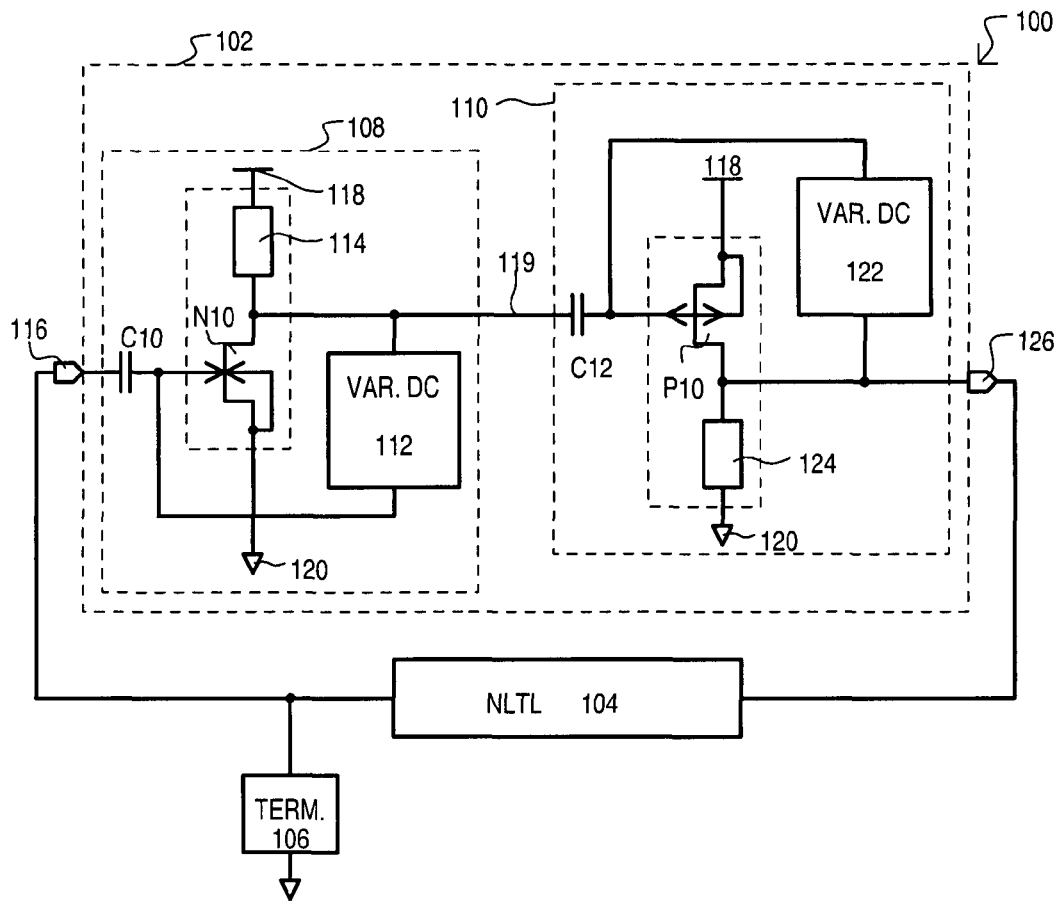
FIG. 1
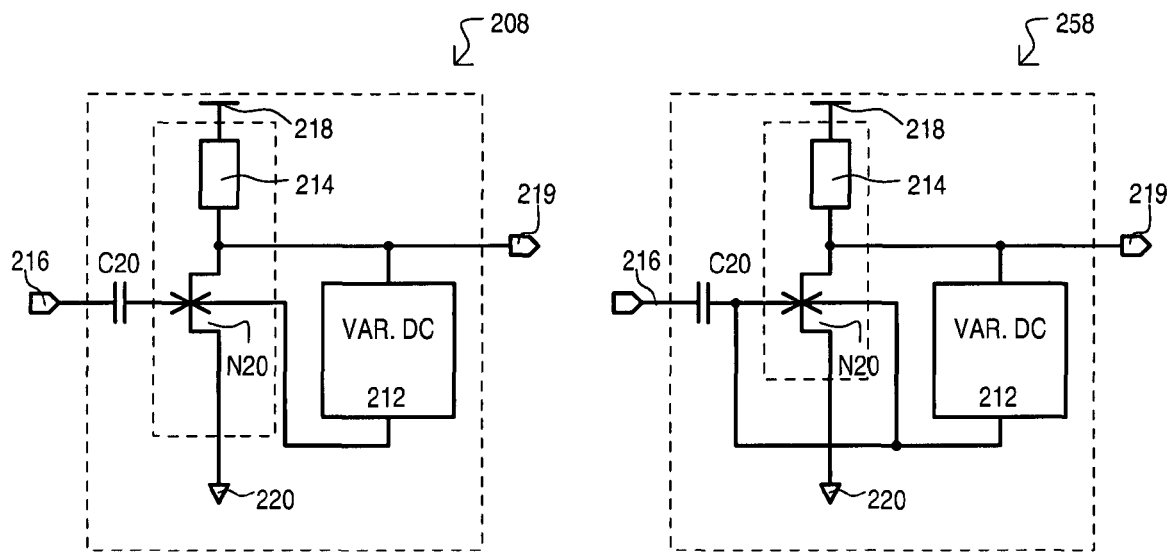
FIG. 2A
FIG. 2B

CIRCUIT AND METHOD FOR GENERATING ELECTRICAL SOLUTIONS WITH JUNCTION FIELD EFFECT TRANSISTORS

This application claims the benefit of U.S. Provisional Patent Application Ser. No. 60/848,253, filed on Sep. 28, 2006, the contents of which are incorporated by reference herein.

TECHNICAL FIELD

The present invention relates generally to pulse generating circuits, and more particularly to circuits for generating electrical solitons.

BACKGROUND OF THE INVENTION

Electrical solitons are voltage pulses that can propagate along non-linear transmission lines with minimal distortion. As such, electrical solitons can be transmitted at higher efficiency and/or greater rates than conventional systems driving pulses on linear transmission lines.

While conventional soliton generators, in the form of soliton oscillators, have been created, such circuits have not proved practical of feasible for fabrication in integrated circuit form, particularly at very small geometries (i.e., 65 nm or smaller).

BRIEF SUMMARY OF THE INVENTION

The invention can include a circuit having an amplifier comprising at least a first junction field effect transistor (JFET) of a first conductivity type having a source coupled to a first power supply node, and a drain coupled to an amplifier output node, and a first variable bias circuit coupled between the drain and at least one gate of the first JFET. The first variable bias circuit can alter a direct current (DC) bias to the first JFET according a potential at the amplifier output node. A non-linear transmission line (NLTL) can be coupled between the amplifier output and a gate of the first JFET. The NLTL can be configured to propagate an electrical soliton.

BRIEF DESCRIPTION OF THE DRAWINGS

FIG. 1 is a block schematic diagram of a soliton oscillator circuit according to a first embodiment.

FIGS. 2A and 2B are block schematic diagrams of alternate adaptive biasing arrangements for an n-channel junction field effect transistor (NJFET) based amplifier section.

DETAILED DESCRIPTION OF THE EMBODIMENTS

Figure 3A:
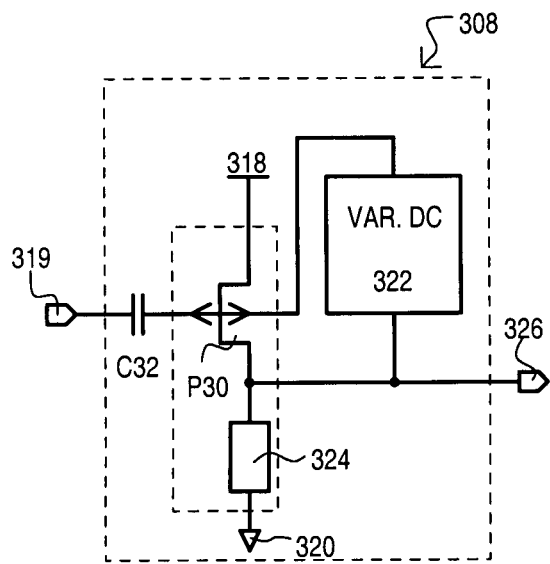
FIGS. 3A and 3B are block schematic diagrams of alternate adaptive biasing arrangements for a p-channel JFET (PJFET) amplifier section.

Various embodiments of the present invention will now be described in detail with reference to a number of drawings. The embodiments show soliton generators and related circuits and methods constructed with junction field effect transistors (JFETs). Such JFETs can include three terminal JFETs, or preferably four terminal JFETs of complementary conductivity types (n-channel and p-channel types). Four terminal JFETs can include two control terminals on different sides of a channel region.

Referring now to FIG. 1, a soliton generating circuit according to a first embodiment is shown in a block schematic diagram, and designated by the general reference character 100. Circuit 100 can be an oscillator circuit that gives rise to the generation of solitons suitable for transmission through a non-linear transmission line (NLTL).

In the particular example of FIG. 1, a circuit 100 can include an amplifier 102, an NLTL 104, and a termination circuit 106. An amplifier 104 can be an adaptive amplifier that varies its operating point according to a direct current (DC) component of a resulting output signal. Unlike conventional approaches that utilize metal-oxide-semiconductor (MOS) type transistors, and thus can present a limit to scalability, amplifier 104 shown in FIG. 1 can utilize JFETs that may advantageously operate at lower power supply voltages.

In the very particular example of FIG. 1, amplifier 104 can include an n-channel JFET (NJFET) section 108 and a p-channel JFET (PJFET) section 110. NJFET section 108 includes an NJFET N10, an input coupling capacitor C10, a variable DC bias circuit 112, and a bias impedance 114. Capacitor C10 can have one terminal connected to an amplifier input 116 and another terminal connected to a first gate of NJFET N10. Bias impedance 114 can be connected between a drain of NJFET N10 and a first power supply node 118. A source of NJFET N10 can be connected to a second power supply node 120. A drain of NJFET N10 can be connected to an intermediate node 119.

In the particular example of FIG. 1, a second gate of NJFET N10 can be connected to its source. However, alternate embodiments can have a different second gate connection, as will shown below.

Variable DC bias circuit 112 can be connected between a drain and a first gate of NJFET N10. Variable DC bias circuit 112 can apply a DC bias voltage to the first gate of NJFET N10 according to the DC voltage present at the drain of NJFET N10 (i.e., the output of NJFET section 108). In this way, a biasing for NJFET N10 can be adaptive to a generated output value, reducing gain as soliton pulse size increases. That is, as a DC voltage at a drain of NJFET N10 increases, a resulting bias voltage at the first gate of NJFET N10 will decrease.

PJFET section 110 can have the same general structure as NJFET section 108, including an input coupling capacitor C12, a variable DC bias circuit 122, and a bias impedance 124. A drain of PJFET P10 can be connected to an amplifier output 126. Input coupling capacitor C12 can have one terminal connected to intermediate node 119 and another terminal connected to a first gate of PJFET P10.

Variable DC bias circuit 122 can operate in the same general fashion as variable DC bias circuit 112, but with respect to the threshold voltages of PJFET P10. Thus, variable DC bias circuit 122 can apply a DC bias voltage to a first gate of PJFET P10 according to the DC voltage present at the drain of PJFET P10. That is, as a DC voltage at a drain of PJFET P10 decreases, a resulting bias voltage at the first gate of PJFET P10 can increase.

Like the NJFET N10, in the particular example of FIG. 1, a second gate of PJFET P10 can be connected to its source. However, alternate embodiments can have a different second gate connection, as will shown below.

NLTL 104 can be connected between amplifier input 116 and amplifier output 126. NLTL 104 can provide a non-linear response that can give rise to solitons. Various structures for an NLTL 104 are described in more detail below.

A termination circuit 106 can provide suitable termination to enable the generation and sustaining of solitons in the circuit. According to one particular embodiment, a termination value can be the average characteristic impedance for signal propagating through the circuit (where it is understood that impedance is variable due to the non-linear nature of NLTL 106).

In this way, a soliton generator circuit can form an oscillator that includes JFET devices for forming and sustaining solitons.

Referring now to FIGS. 2A and 2B, various alternate DC bias arrangements for NJFET sections are shown block schematic diagrams. These arrangements show the same general circuit sections as item 108 of FIG. 1, thus like sections will be referred to by the same reference character but with a first digit being "2" instead of a "1".

NJFET section 208 of FIG. 2A can differ from that of FIG. 1 in that DC biasing voltage generated by a variable DC biasing circuit 212 can be applied to a second gate of an NJFET N20, rather than a first gate.

NJFET section 258 of FIG. 2B can differ from that of FIG. 1 in that DC biasing voltage generated by a variable DC biasing circuit 212 can be applied to both a first gate and a second gate of an NJFET N20.

Figure 3B:
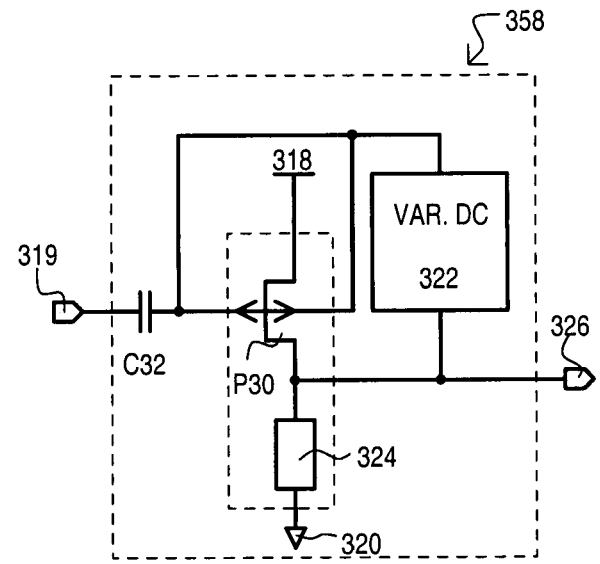

Referring now to FIGS. 3A and 3B, various alternate DC bias arrangements for PJFET sections are shown block schematic diagrams. These arrangements show the same general circuit sections as item 108 of FIG. 1, thus like sections will be referred to by the same reference character but with a first digit being "3" instead of a "1".

In the same general fashion as FIGS. 2A and 2B, FIG. 3A shows a DC biasing voltage applied to a second gate of a PJFET P30, while FIG. 3B shows a DC biasing voltage applied to both a first and second gate of a PJFET P30.

In this way, a DC biasing voltage for dynamically adjusting a gain of an amplifier JFET can be applied to either or both gates of such amplifier JFETs.

Figure 3C:
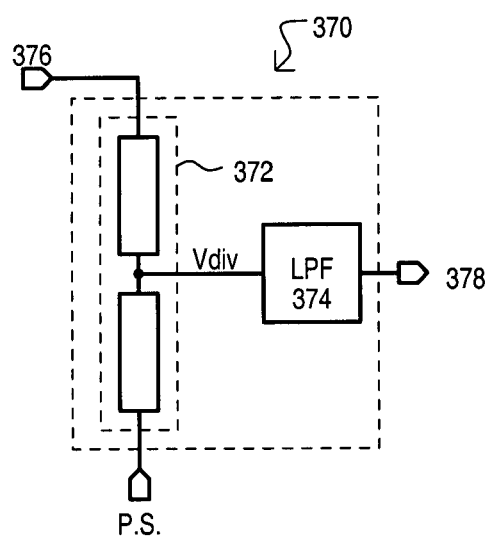
FIG. 3C is a block schematic diagram of a variable direct current (DC) bias circuit according to an embodiment.

Referring now to FIG. 3C, an example of a variable DC biasing circuit, like those shown as 112 and 122 in FIG. 1, is shown in a block schematic diagram, and designated by the general reference character 370. A variable DC biasing circuit 370 can include a voltage divider 372 and a low pass filter (LPF) 374. A voltage divider 372 can be connected between an input node 376 and a power supply node 378, and can include two or more impedance elements to divide a potential present at input node 376 to generate a divided voltage Vdiv. A divided voltage Vdiv can be filtered by LPF 374 to generate a DC bias voltage at an output node 378. Such a bias voltage DC can be fedback to a gate of a transistor to alter its gain response.

Figure 4:
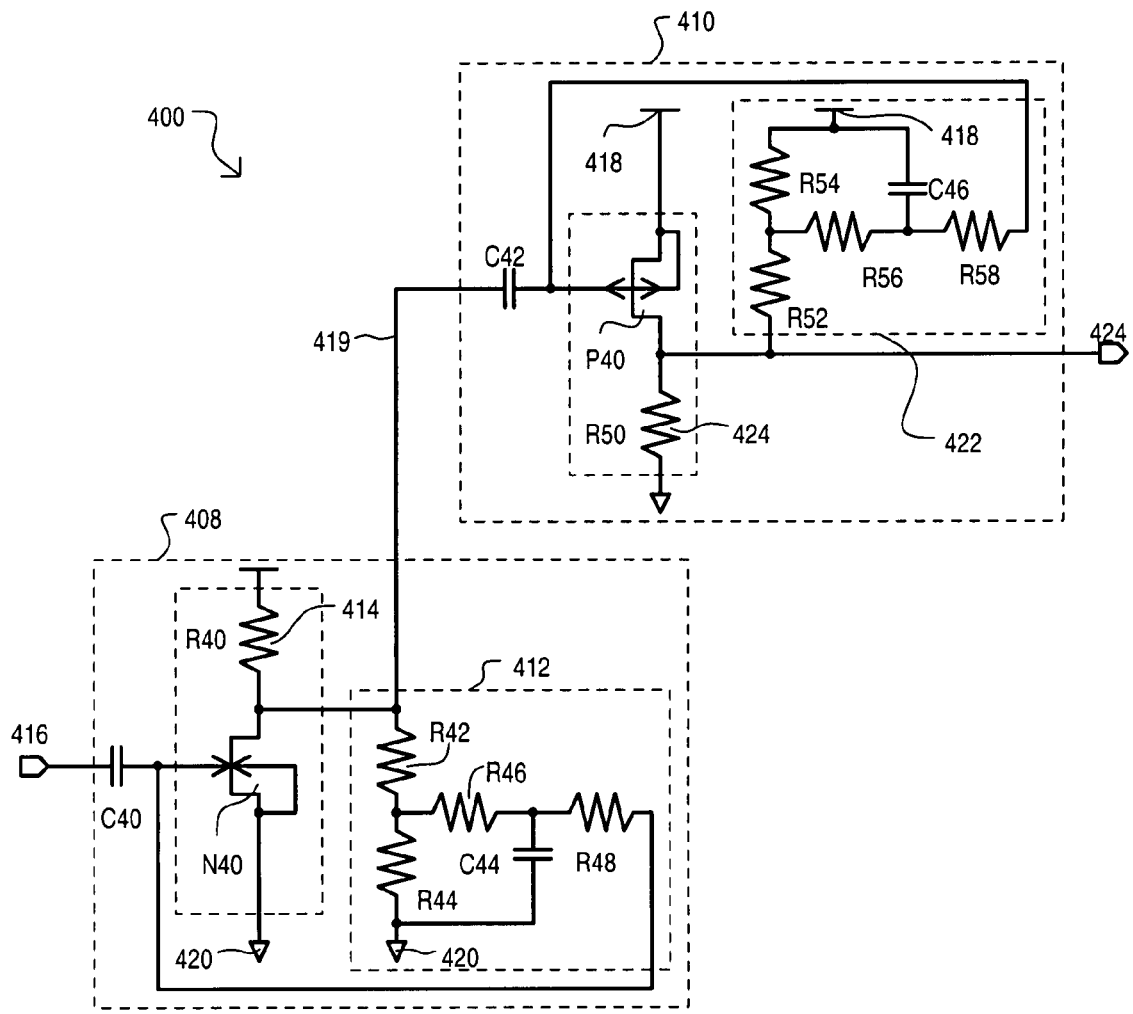
FIG. 4 is a schematic diagram of an amplifier circuit according to an embodiment of the present invention.

Referring now to FIG. 4, an example of an amplifier that can be used to generate electrical solitons according to one embodiment is shown in a schematic diagram and designated by the general reference character 400. Amplifier 400 can include some of the same general circuit sections as 102 of FIG. 1, thus like sections will be referred to by the same reference character but with a first digit being "4" instead of a "1".

Within amplifier 400, an NJFET section 408 can include a bias impedance 414 formed by a resistance R40. A variable biasing circuit 412 can include a voltage divider R42/R44 connected between a drain of NJFET N40 and a power supply node 420. A divided voltage value can be filtered by a low pass filter R46/C44, and coupled to a first gate of NFET by way of resistor R48.

In a similar fashion, a PJFET section 410 can include a bias impedance 424 formed by a resistance R50. A variable biasing circuit 422 can include a voltage divider R52/R54 connected between a drain of PJFET P40 and a power supply node 418, as well as low pass filter R56/C46, and resistor R58.

Figure 5:
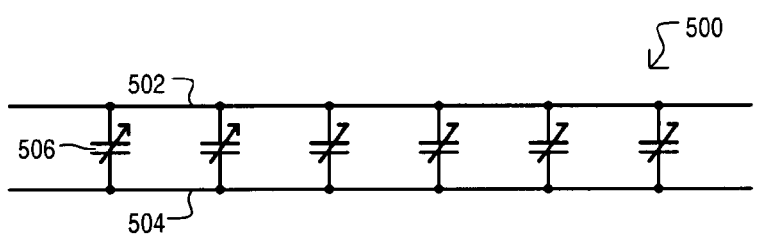
FIG. 5 is a schematic diagram of a non-linear transmission line (NLTL) that can be included in the embodiments.

Referring now to FIG. 5, one example of a NLTL according to an embodiment is shown in a schematic diagram and designated by the general reference character 500. An NLTL 500 can include a first conductive line 502, second conductive line 504, and a number of variable capacitors (one shown as 506) formed periodically between conductive lines 502 and 504. Variable capacitors (e.g., 506) can provide a capacitance that varies according to a voltage. As but a few examples, a variable capacitor can be formed by a reverse biased p-n junction diode.

Figure 6A:
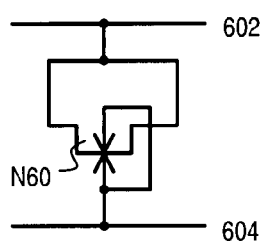
FIGS. 6A and 6B are diagrams of variable capacitors that can be used in a NLTL according to an embodiment.
Figure 6B:
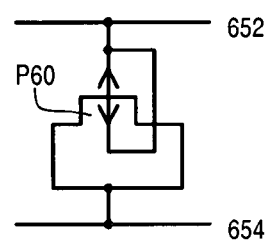

While variable capacitors (varactor elements) for a NLTL can be conventional structures formed according to conventional processes, it may be desirable to utilize a same manufacturing process that forms amplifier JFETs to create such NLTL varactor elements. Particular examples of such structures are shown in FIGS. 6A and 6B. FIG. 6A shows an NJFET N60 configured into a p-n junction formed between conductive lines 602 and 604. Similarly, FIG. 6B shows a PJFET P60 configured into a p-n junction formed between conductive lines 652 and 654.

In this way, varactor elements for an NLTL for propagating solitons can be formed with the same type of JFET devices utilized in an amplifier that generates such solitons.

Referring back to FIG. 1, it is understood that an oscillation circuit 100 can oscillate at a frequency determined by a particular soliton "mode". That is, a given soliton propagation path can give rise to single propagating soliton (mode n=1) to various higher modes in which multiple solitons propagate with equal spacing from one another (mode n>1). Different modes can be established by varying a steady state bias point of an oscillator amplifier. In particular, lower bias points can give rise to higher modes of operation. By selectively altering such a bias point, different modes can be generated. Two particular examples of variable mode approaches are shown in FIGS. 7 and 8.

Figures 7, 8:
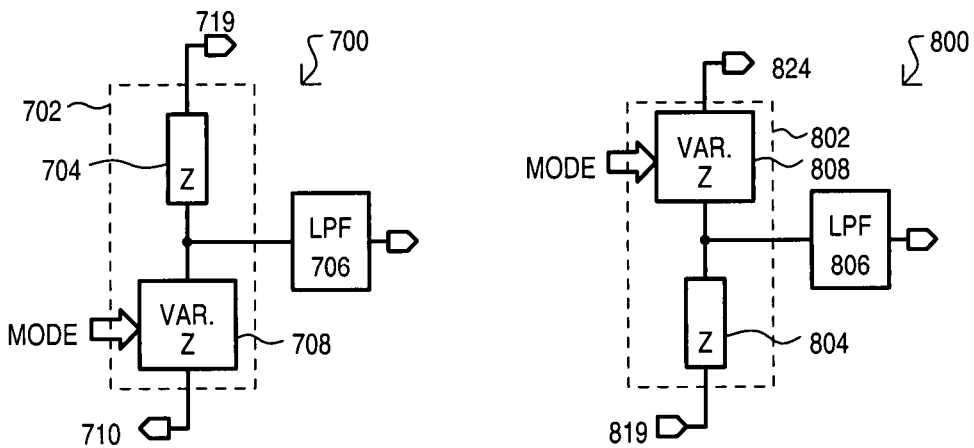
FIG. 7 is a block schematic diagram of gain adjustment approach for an NJFET amplifier section according to an embodiment.
FIG. 8 is a block schematic diagram of gain adjustment approach for a PJFET amplifier section according to an embodiment.

FIG. 7 shows one example of a variable DC biasing circuit that can provide differing biasing points for an amplifier like those described above. Biasing circuit 700 can be utilized as a variable DC biasing circuit connected to an NJFET. A biasing circuit 700 can include one or more variable impedance elements in a voltage divider section. In the particular example of FIG. 7, a voltage divider 702 can include a first impedance element 704 connected between a node 719 and an input to a LPF 706. A variable impedance circuit 708 can be connected between a power supply node 710 and the input of LPF 706. In response to difference values MODE, variable impedance circuit 708 can provide different impedance values. By altering such impedance values, the proportional voltage feedback to limit gain can be changed, thus lowering or raising a biasing point of an amplifier.

FIG. 8 shows an example of a variable DC biasing circuit that can be utilized as a variable DC biasing circuit connected to a PJFET. A biasing circuit 800 can have the same general structure as that of FIG. 7, but configured for a p-channel device. Thus, biasing circuit 800 can have a voltage divider 802 that includes a variable impedance circuit 808.

Of course, FIGS. 7 and 8 show but two examples of altering the biasing point of a JFET based amplifier, and should not necessarily be construed as limiting the invention thereto.

Figure 9:
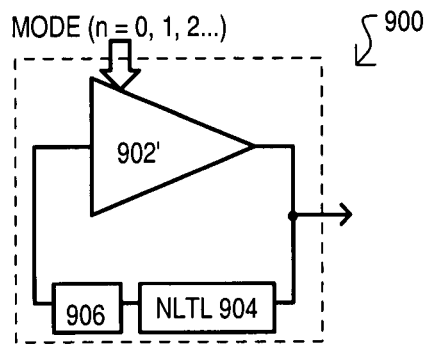
FIG. 9 is a diagram showing a frequency multiplier according to an embodiment.

FIG. 9 shows a programmable frequency multiplier circuit according to an embodiment of the present invention, designated by the general reference character 900. A frequency multiplier circuit 900 can include some of the same general sections as FIG. 1, including an amplifier 902', NLTL 904, and termination circuit 906. However, amplifier 902' can provide a bias point selectable according to a value MODE. Thus, for a higher steady state bias point, a circuit can oscillate at a higher frequency.

In this way, a JFET soliton oscillator can be configurable between different soliton propagation modes, giving rise to different operating frequencies.

A soliton generator, like those described above, can be used to generate data signals for an integrated circuit device. Various examples of such approaches will now be described.

Figure 10:
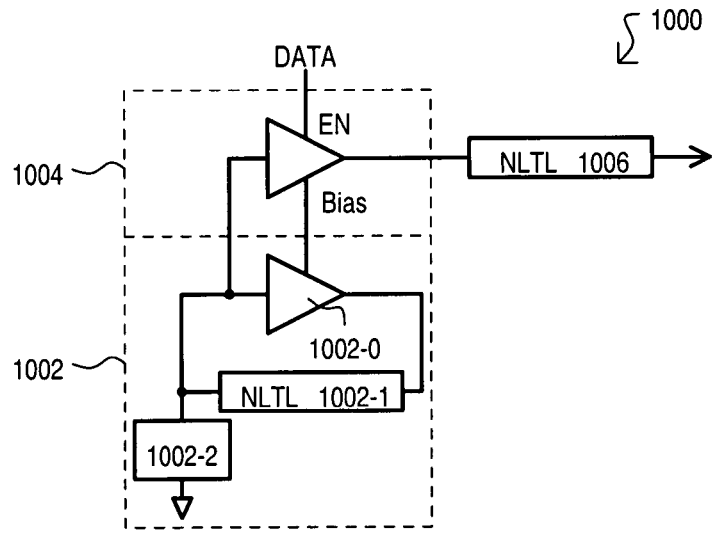
FIG. 10 is a block schematic diagram showing a data transmission system according to an embodiment.

Referring to FIG. 10, one example of a data transmission system is shown in a block schematic diagram, and designated by the general reference character 1000. A system 1000 can include a soliton oscillator 1002, a pulse generator 1004, and a transmission NLTL 1006. A soliton oscillator 1002 can take the form of any of those oscillator embodiments and variations described above, and can include an amplifier 1002-0, a NLTL 1002-1 and a termination circuit 1002-2.

A pulse generator 1004 can generate a pulse based on a soliton generated by soliton oscillator 1002 and a data input value DATA. For example, if DATA is "1", pulse generator 1004 can be enabled and output a pulse for propagation down transmission NLTL 1006. However, if a DATA is "0", pulse generator 1004 can be disabled, and no pulse can be generated. Preferably, transmission NLTL 1006 matches NLTL 1002-1 within soliton oscillator 1002, and pulse generator 1004 reproduces solitons generated by soliton oscillator 1002.

Figure 11:
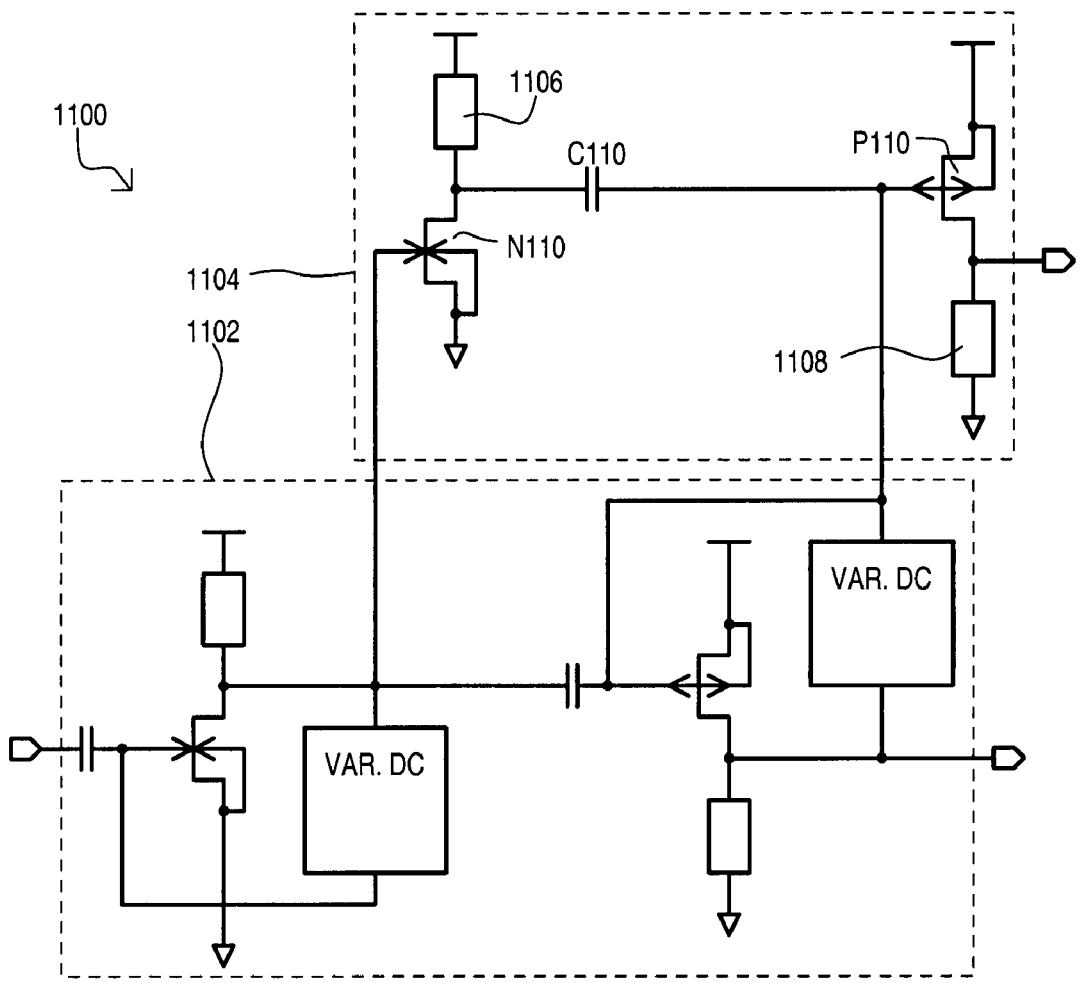
FIG. 11 is a block schematic diagram showing a pulse generator according to an embodiment.

One particular example of an amplifier and pulse generator is shown in FIG. 11, and designated by the general reference character 1100. In FIG. 11, an amplifier 1102 can correspond to item 1002 of FIG. 10, and a pulse generator 1104 can correspond to item 1004 of FIG. 10.

In the particular example of FIG. 11, amplifier 1102 can have the same construction as amplifier 102 of FIG. 1, and so a detailed description will be omitted.

A pulse generator 1104 can be constructed to mirror operation of the amplifier 1102. In the example shown, pulse generator 1104 includes NJFET N110 and bias impedance 1108 configured in the same fashion as the NJFET section of amplifier 1102. Further, a PJFET P110, coupling capacitor C110, and bias impedance 1110 can be configured in the same fashion as PJFET section of amplifier 1102.

In this way, a pulse generator 1104 can essentially reproduce solitons generated by amplifier 1102.

A pulse generator 1104 can be selectively disabled based on a desired output value according to various approaches. For example, transistors within a pulse generator can be tristatable by including devices in pull-up/pull-down paths. Alternatively, a path between a pulse generator and transmission NLTL can be selectively enabled or disabled, with suitable impedance matching with the NLTL.

Figure 12:
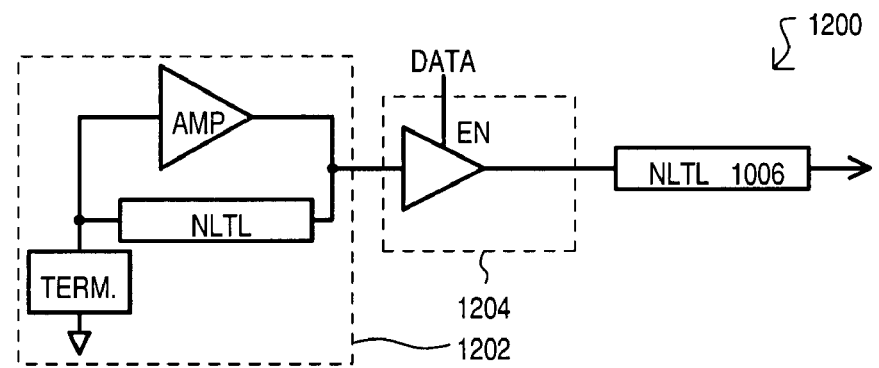
FIG. 12 is a block schematic diagram showing a data transmission system according to another embodiment.

Referring to FIG. 12, another example of a data transmission system is shown in a block schematic diagram, and designated by the general reference character 1200. As in the case of FIG. 10, a system 1200 can include a soliton oscillator 1202, a pulse generator 1204, and a transmission NLTL 1206. A soliton oscillator 1202 can take the form of any of those oscillator embodiments and variations described above.

However, in the arrangement of FIG. 12, a pulse generator 1204 can have an input connected to the NLTL of soliton oscillator 1202. As but one example, a pulse generator 1204 can be a very high input impedance amplifier.

The generation of solitons according to the various embodiments can be utilized to transmit data between different sections of a system. Two of many possible arrangements are shown in FIGS. 13 and 14.

Figures 13, 14:
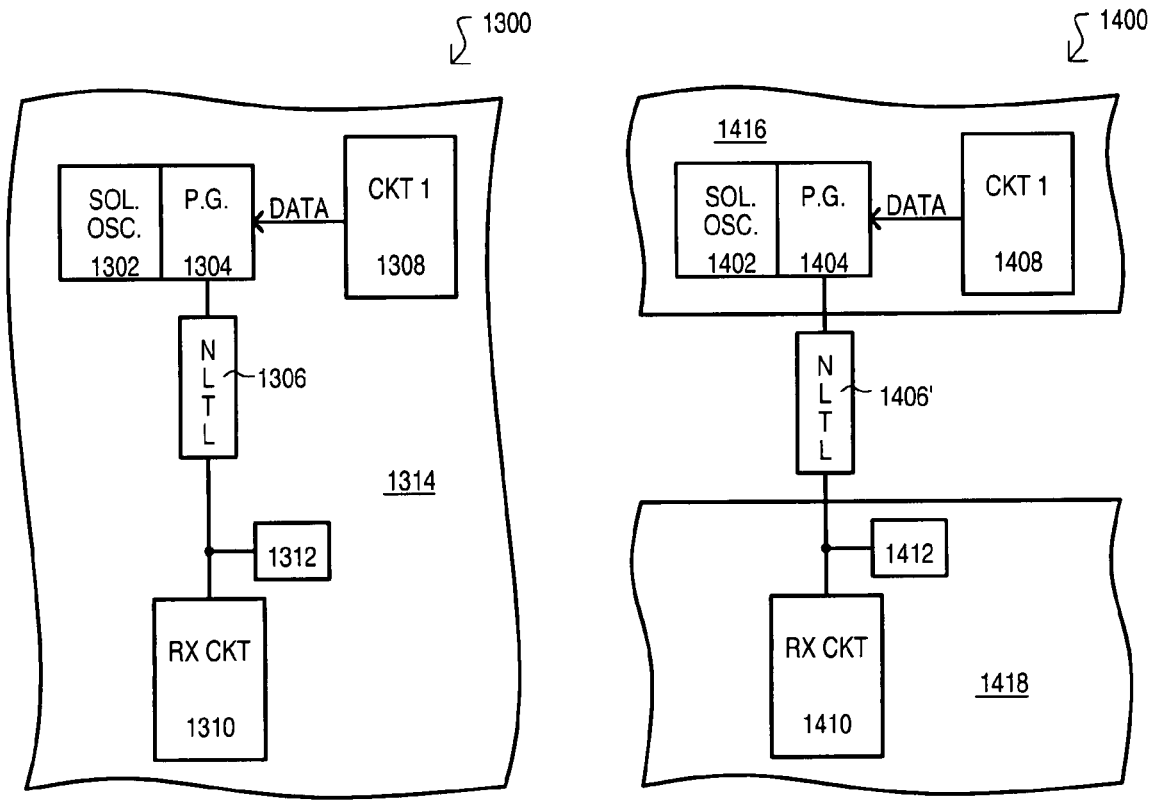
FIG. 13 is a block schematic diagram of an intra-chip data transmission arrangement according to an embodiment.
FIG. 14 is a block schematic diagram of an inter-chip data transmission arrangement according to an embodiment.

FIG. 13 is a block schematic diagram showing a single intra-chip data path in a system according to an embodiment, designated by the general reference character 1300. A system 1300 can include a soliton oscillator 1302, pulse generator 1304, and transmission NLTL 1306, according to any of the embodiments and variations shown above. Further, a data input to a pulse generator 1304 can be provided by a first functional circuit 1308. A first functional circuit 1308 can be a circuit that provides data output values according to input values. As but a few examples, a first functional circuit can be any of a random access memory (RAM), a programmable read only memory (PROM), a logic circuit, and a programmable logic circuit.

A data receiving section 1310 can be connected to a receiving end of transmission NLTL 1306. An impedance matching circuit 1312 can also be included.

A pulse generator 1304 can generate a soliton suitable for transmission NLTL 1306. In one very particular embodiment, transmission NLTL 1306 can match an NLTL within soliton oscillator 1302, and pulse generator 1304 can reproduce a soliton generated by soliton oscillator 1302 for propagation down transmission NLTL 1306.

It is understood that elements 1304, 1306, 1308, 1310 and 1312 can all formed on the same substrate of an integrated circuit 1314. Preferably soliton oscillator 1302 is also formed on the same integrated circuit substrate. Further, while one data path is shown, multiple such data paths can be included in one device.

Referring now to FIG. 14, a block schematic diagram of a single inter-chip data path in a system according to an embodiment is shown and designated by the general reference character 1400. A system 1400 can include the same general circuit sections as FIG. 13. However, a transmission NLTL 1406' can be situated between two different integrated circuits 1416 and 1418. In addition, elements 1404 and 1408 can be formed on one integrated circuit 1416, while item 1410 can be formed on the other integrated circuit 1418. Preferably, a soliton oscillator 1402 is also formed on integrated circuit 1416.

In this way, a soliton generator can be utilized for intra- and/or inter-chip data communication.

While the above soliton generator embodiments are preferably robustly tuned to provide one or more soliton propagation modes, and thus produce solitons at an essentially constant frequency, in alternate embodiments it may be desirable to make such circuits susceptible to random noise events. Such embodiments may find use in pseudo random number generation and/or encryption hardware, as but a few examples.

Figure 15:
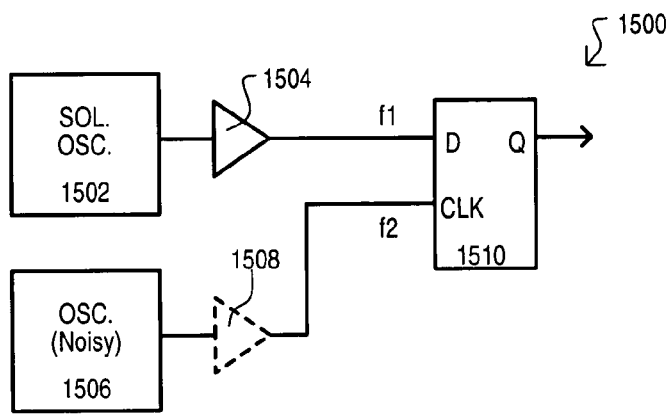
FIG. 15 is a block schematic diagram of a pseudo random number generator according to an embodiment.

One very particular example of a system utilizing a noise susceptible soliton oscillator is shown in FIG. 15 and designated by the general reference character 1500. A system 1500 can include a first oscillator 1502, a first pulse generator 1504, a second oscillator 1506, optionally a second pulse generator 1508, and sampling logic 1510. A first oscillator 1502 is preferably a soliton oscillator that generates solitons at a frequency $f_1$, and first pulse generator 1502 can generate pulses at the same frequency that are suitable for sampling logic 1508.

A second oscillator 1506 can generates a signal at about a frequency $f_2$, slower than frequency $f_1$, but subject to variation due to essentially random noise, such as that coupled via a substrate, power supply and/or thermal noise. In one particular arrangement, a second oscillator 1506 can be a soliton oscillator operating at a lower mode than first oscillator 1502, and thus include a pulse generator 1508 to shape inputs to sampling logic 1510, if needed.

Sampling logic 1510 can utilize lower, noise varying signal $f_2$ to sample higher frequency signal $f_1$. A resulting output can be pseudorandom sequence of bit values.

In this way, one or more JFET based soliton generators can be used in pseudorandom generators and related applications.

Figure 16:
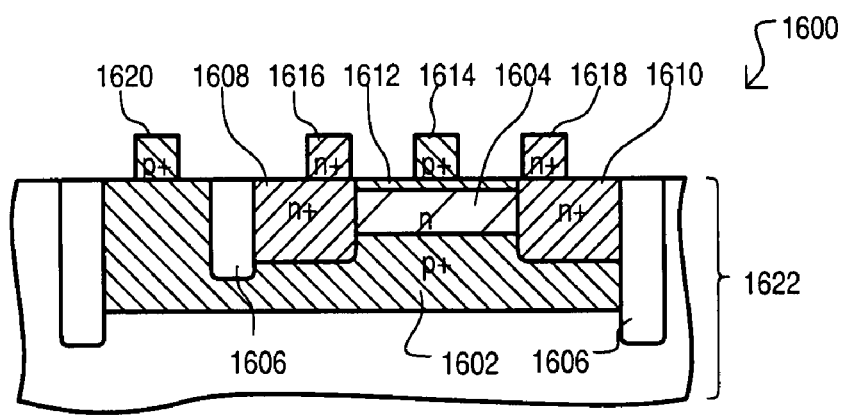
FIG. 16 is a side cross sectional view showing an example of an n-channel JFET that can be included in the embodiments.
Figure 17:
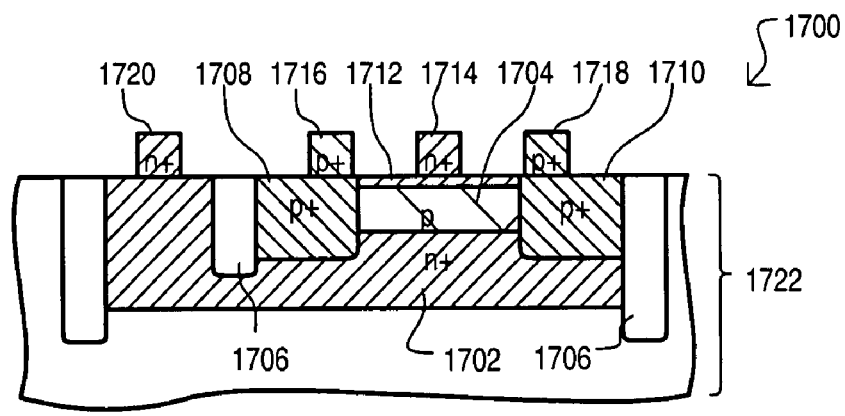
FIG. 17 is a side cross sectional view showing an example of a p-channel JFET that can be included in the embodiments.

While the JFET devices shown in the above embodiments can take various forms, particular examples of possible JFET devices that can be included in the embodiments will now be described with reference to FIGS. 16 and 17. FIG. 16 is a side cross sectional view showing one particular example of an n-channel JFET device. FIG. 17 is a cross sectional view showing one particular example of a p-channel JFET device.

Referring to FIG. 16, an NJFET 1600 can include a substrate region 1602, a channel region 1604, isolation structures 1606, a source region 1608, a drain region 1610, a top gate region 1612, a top gate terminal 1614, a source terminal 1616, a drain terminal 1618. A potential can be applied to substrate region 1602 by way of a fourth control terminal 1620.

As show in FIG. 16, substrate region 1602, channel region 1604, source region 1608, drain region 1610, and top gate region 1612 can be doped regions in a common substrate 1622. More particularly, substrate region 1602 and top gate region 1612 can be a semiconductor material having a high concentration of p-type dopants (p+). In contrast, source region 1608 and drain region 1610 can be a semiconductor material having a high concentration of n-type dopants (n+), while channel region 1604 can be a more lightly doped n-type region. Preferably, a substrate 1622 includes silicon, more preferably is composed of monocrystalline silicon. Alternatively, a substrate can be "strained" silicon formed by a lower layer of silicon-germanium. Still further, a substrate can include a silicon-on-insulator arrangement, in which case a substrate region 1602 can be formed above the insulating layer, or may be omitted (i.e., a channel region 1604 can be bounded in vertical direction by top gate region 1612 and an SOI insulating layer).

A top gate terminal 1614, a source terminal 1616, a drain terminal 1618, and a fourth control terminal 1620 can be formed on a substrate surface. Top gate terminal 1614 can be in direct contact with a top gate region 1612, while source terminal 1616 and drain terminal 1618 are in direct contact with source region 1608 and drain region 1610, respectively. Fourth control terminal 1620 can be in direct contact with substrate region 1602. Preferably, a top gate terminal 1614, a source terminal 1616, a drain terminal 1618, and a fourth control terminal 1620 are doped semiconductor material, with top gate terminal 1614 and fourth control terminal 1620 being p+ doped and source and drain terminals (1616 and 1618) being n+ doped. Even more preferably, a top gate terminal 1614, a source terminal 1616, a drain terminal 1618, and a fourth control terminal 1620 can be formed from a same layer of semiconductor material deposited on a substrate surface and subsequently patterned and doped, such as a layer of polycrystalline silicon and/or amorphous silicon.

A fourth control terminal 1620 in conjunction with a substrate region 1602 can function as a bottom gate of the NJFET 1600.

Isolation structures 1606 can provide electrical isolation for NJFET 1600 in a lateral direction (e.g., parallel to a substrate surface). In one particular arrangement, isolation structure 1606 can be formed with shallow trench isolation (STI) techniques.

FIG. 17 includes the same general configuration as FIG. 16, but with opposite doping types. Like features are referred to with the same reference, but with the first two digits being "17" instead of "16".

It is noted that NJFET 1600 of FIG. 16 and PJFET 1700 of FIG. 17 can have advantageously low operating voltages (less than a diode cut-off voltage). Further, such devices may have better leakage characteristics than insulated gate field effect transistors of the same channel size. In addition, doping for such devices can be varied to form JFETs (of either n-channel of p-channel type) that operate as "enhancement" mode devices.

It is understood that reference in the description to "one embodiment" or "an embodiment" means that a particular feature, structure, or characteristic described in connection with the embodiment is included in at least one embodiment of the invention. The appearance of the phrase "in one embodiment" in various places in the specification do not necessarily all refer to the same embodiment. The term "to couple" or "electrically connect" as used herein may include both to directly and to indirectly connect through one or more intervening components.

Further it is understood that the embodiments of the invention may be practiced in the absence of an element or step not specifically disclosed. That is an inventive feature of the invention may include an elimination of an element.

While various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A circuit for generating electrical solitons, comprising:
   a first amplifier having a gain variable according to at least a magnitude of a voltage at an output of the first amplifier, the first amplifier comprising at least one oscillator junction field effect transistor (JFET) that includes a gate of a semiconductor material doped to a first conductivity type formed on a channel of semiconductor material doped to a second conductivity type, the gate of the at least one oscillator JFET being coupled to an input of the first amplifier by a coupling capacitance;

a feedback non-linear transmission line (NLTL) coupled between the output and the input of the first amplifier; and a pulse generator having a gain variable according to at least a magnitude of the voltage at the output of the first amplifier.

2. The circuit claim 1, wherein:

the at least one oscillator JFET includes
- a first oscillator JFET of a first channel conductivity type having a source coupled to a first power supply node, and a drain coupled to an intermediate node, and
- a second oscillator JFET of a second channel conductivity type having a gate coupled to the intermediate node, a source coupled to a second power supply node, and a drain coupled to the output of the first amplifier.

3. The circuit of claim 1, wherein:

the feedback NLTL comprises variable capacitors periodically coupled between two conductive lines, the variable capacitors providing a capacitance that varies according to the potential between the two conductive lines.

4. The circuit of claim 1, wherein:

the pulse generator comprises at least one transmission JFET that includes a gate of a semiconductor material doped to the first conductivity type formed on a substrate of semiconductor material doped to the second conductivity type, the gate of the at least one transmission JFET being coupled to the input of the first amplifier; and a transmission NLTL coupled to an output of the pulse generator, the transmission NLTL having a same repeating structure as the feedback NLTL.

5. The circuit of claim 4, wherein:

the first amplifier includes a variable bias stage coupled between the drain and at least one gate of the at least one oscillator JFET, the variable bias stage generating a bias voltage that varies according to the potential at the intermediate node; and the at least one transmission JFET has a gate coupled to the drain of the at least one oscillator JFET.

6. The circuit of claim 4, further including:

the pulse generator is disabled and enabled according to an enable input; and a main integrated circuit section including at least one data output coupled to the enable input of the pulse generator.

7. The circuit of claim 6, wherein:

the main integrated circuit portion is selected from the group consisting of: a random access memory (RAM), a programmable read only memory (PROM), a logic circuit, and a programmable logic circuit.

8. The circuit of claim 4, wherein:

the transmission NLTL is formed on a same substrate containing the first amplifier and pulse generator.

9. The circuit of claim 4, wherein:

the transmission NLTL couples a first substrate containing the first amplifier and pulse generator to a second substrate different from the first substrate.

10. The circuit of claim 1, further including:

the first amplifier and NLTL form portions of a first oscillator circuit that outputs a first signal having about a first frequency;

a second oscillator that outputs a second signal having about a second frequency, the second amplifier varying from the second frequency according to noise; and a logic circuit for logically combining the first signal and the second signal to generate a pseudorandom sequence of pulses.

* * * * *

UNITED STATES PATENT AND TRADEMARK OFFICE
CERTIFICATE OF CORRECTION

PATENT NO. : 7,764,137 B2  Page 1 of 1
APPLICATION NO. : 11/903296
DATED : July 27, 2010
INVENTOR(S) : Christopher L. Hamlin It is certified that error appears in the above-identified patent and that said Letters Patent is hereby corrected as shown below:

ON THE TITLE PAGE

At Item (54), Title, please replace the title
-- CIRCUIT AND METHOD FOR GENERATING ELECTRICAL SOLUTIONS WITH JUNCTION FIELD EFFECT TRANSISTORS --
with the following title
-- CIRCUIT AND METHOD FOR GENERATING ELECTRICAL SOLITONS WITH JUNCTION FIELD EFFECT TRANSISTORS --.

Signed and Sealed this

Fifth Day of October, 2010

David J. Kappos
*Director of the United States Patent and Trademark Office*

UNITED STATES PATENT AND TRADEMARK OFFICE
CERTIFICATE OF CORRECTION

PATENT NO.       : 7,764,137 B2                                                           Page 1 of 1
APPLICATION NO.  : 11/903296
DATED            : July 27, 2010
INVENTOR(S)      : Christopher L. Hamlin It is certified that error appears in the above-identified patent and that said Letters Patent is hereby corrected as shown below:

ON THE TITLE PAGE, ITEM (54) AND AT COLUMN 1, LINES 1-3

Please replace the title

-- CIRCUIT AND METHOD FOR GENERATING ELECTRICAL SOLUTIONS WITH JUNCTION FIELD EFFECT TRANSISTORS -- with the following title

-- CIRCUIT AND METHOD FOR GENERATING ELECTRICAL SOLITONS WITH JUNCTION FIELD EFFECT TRANSISTORS --.

This certificate supersedes the Certificate of Correction issued October 5, 2010.

Signed and Sealed this

Ninth Day of November, 2010

David J. Kappos
*Director of the United States Patent and Trademark Office*